(12) United States Patent
Parsons (10) Patent No.: US 6,995,691 B2
(45) Date of Patent: Feb. 7, 2006

(54) BONDED STRUCTURE USING REACTED BOROSILICATE MIXTURE

(75) Inventor: James D. Parsons, Reno, NV (US)

(73) Assignee: Heetronix, Reno, NV (US)

( * ) Notice: Subject to any disclaimer, the term of this patent is extended or adjusted under 35 U.S.C. 154(b) by 823 days.

(21) Appl. No.: 09/783,831

(22) Filed: Feb. 14, 2001

(65) Prior Publication Data

US 2002/0109590 A1 Aug. 15, 2002

(51) Int. Cl.
    *H01L 23/29* (2006.01)
(52) U.S. Cl. ............... 340/999; 257/467; 257/470; 257/634; 257/783; 257/794; 257/E21.122
(58) Field of Classification Search ............... 340/999; 257/467, 537, 470, 703, 783, 794, 641, 644, 257/650, 634, 633, E21.122; 438/695, 745, 438/753
See application file for complete search history.

(56) References Cited

U.S. PATENT DOCUMENTS

| | | | | |
|---|---|---|---|---|
| 3,726,006 A | * | 4/1973 | Muckelroy | 29/846 |
| 4,803,375 A | * | 2/1989 | Saito et al. | 250/208.1 |
| 5,431,806 A | * | 7/1995 | Suzuki et al. | 204/415 |
| 5,436,494 A | | 7/1995 | Moslehi | 257/467 |
| 5,610,572 A | | 3/1997 | Yajima | 338/22 |
| 6,221,763 B1 | * | 4/2001 | Gilton et al. | 438/643 |
| 6,331,362 B1 | * | 12/2001 | Dupel et al. | 428/689 |
| 6,576,972 B1 | * | 6/2003 | Parsons | 257/470 |
| 6,613,678 B1 | * | 9/2003 | Sakaguchi et al. | 438/695 |

OTHER PUBLICATIONS

SensArray Corporation, *Process Probe 1840*, Data Sheet, 1998.
SensArray Corporation, *Process Probe 1530*, Data Sheet, 1998.
SensArray Corporation, *Process Probe 1630*, Data Sheet, 1998.
SensArray Corporation, *1700 Series*, Data Sheet, 1994.
Schott Corporation, *BOROFLOAT Borosilicate Float Glass*, Data Sheet.
Schott Coroporation, *D 163 Thin Borosilicate Glass*, Data Sheet.
Schott Corporation, *AF 45 Thin Borosilicate Glass*, Data Sheet.
SansArray Corporation, *Using SensArray Temperature Instrumented Wafers Series 1501, Type R Thermocouples*, Jun. 10, 1993.
SensArray Corporation, *Using SensArray Temperature Instrumented Wafers Series 1501, Type R Thermocouples*, Feb. 5, 1994.
Bendekovic Z et al: "Polysilicon Temperature Sensor", MELECON '98. 9th Meditrerranean Electrotechnical Conference Proceedings. Tel-Aviv, May 18-20, 1998, Melecon Conferences, New York, NY: IEEE, US, vol. 1, May 18, 1998, pp. 362-366, XP000801264, ISBN: 0-7803-3880-4, p.364.

* cited by examiner

*Primary Examiner*—Davetta W. Goins
(74) *Attorney, Agent, or Firm*—Koppel, Jacobs, Patrick & Heybl (57) ABSTRACT

Environmental sensors and other bodies, together with associated lead wires, are mounted to a oxidizable substrate for high temperature applications by means of a reacted borosilicate mixture (RBM) that secures the body relative to the substrate via of an oxide interface formed between the RBM and substrate during a high temperature reaction process. An oxide interface is also formed with oxidizable bodies to provide further mounting strength. The RBM is a $B_2O_3$—$SiO_2$ mixture, with the $B_2O_3$ portion a function of the reaction temperature and desired bonding strength and viscosity.

51 Claims, 4 Drawing Sheets

BONDED STRUCTURE USING REACTED BOROSILICATE MIXTURE

RELATED APPLICATIONS

This application is related to U.S. patent application Ser. Nos. 09/316,239 and 09/645,383, filed respectively on May 21, 1999 and Aug. 28, 2000 by the present inventor, which disclose an invention claimed in the present application. Priority based upon said application Ser. Nos. 09/316,239 and 09/645,383 is claimed under 35 U.S.C. 120.

BACKGROUND OF THE INVENTION

1. Field of the Invention

This invention relates to the bonding of ceramic, semiconductor and metallic materials to each other, and more particularly to securing an array of environmental sensors and their associated lead wires to a common substrate.

2. Description of the Related Art

In applications such as the semiconductor and liquid crystal display (LCD) manufacturing industries, it is necessary to sense the absolute value and uniformity of environmental factors, such as temperature, radiation, pressure and gas composition and/or concentration, over a given surface area. To this end a plurality of sensors are disposed on a substrate which has the desired area and is placed in the location where sensing is needed. Each sensor, which is typically pre-calibrated to correlate with the values of the sensed quantity, is connected by lead wires to a remotely located response facility which responds to the sensor output, such as by providing a readout of the sensed environmental characteristic and/or controlling other elements of the manufacturing process.

In semiconductor and LCD manufacturing, the absolute temperature and temperature uniformity in processing equipment are important parameters in establishing manufacturing yields. Such processing equipment includes furnaces (such as rapid thermal process, tube, belt and tray furnaces), vacuum sputtering and evaporation equipment, chemical vapor deposition reactors, plasma, reactive ion and wet chemical etchers, the application and removal of photo resist and glass for spinners, chill plates, hot plates and strippers, and wafer and plate chucks used for device and integrated circuit (IC) testing.

The thermal sensors are typically type K, R or S thermocouples (TCs) or thin film platinum resistance temperature detectors (TFRTDs). The TC junctions or TFRTDs are typically mounted within respective cavities in the substrate, and secured within the cavities by a bonding material. The bonding material for TCs is commonly a mixture of $SiO_2$ and $Al_2O_3$, typically 60 wt. % $SiO_2$ and 40 wt. % $Al_2O_3$. TFRTD sensors typically require two cavities each, one for the sensor itself and the other to strengthen lead wire bonding, with the bonding material for both cavities typically an epoxy.

The electrical lead wires for the sensors are typically sheathed in quartz microtubing segments having a maximum temperature rating of 1100° C., braided silica sleeving having a maximum temperature rating of 1100° C., or Teflon® sleeving having a maximum temperature rating of 250° C. The lead wires extend from their respective sensors and are commonly bundled together, with the bundling commencing either on or off the substrate.

Cavities are necessary for accurate temperature calibration of TCs because the TC junctions, plus at least about 2.5 cm of lead wire extending from the junction, must be inside the temperature measurement volume for accurate measurements. Cavities are not necessary for accurate temperature calibration of surface sensors such as TFRTDs, since such sensors need only be in intimate contact with an object to provide accurate temperature measurement. However, in the case of TFRTDs, cavities are commonly employed for purposes of mounting stability.

The substrates typically employed for the sensors, including glass, ceramic and semiconductor wafers, are relatively brittle. Furthermore, semiconductor wafers are generally single crystals that are subject to breakage from mechanical intrusion. The provision of cavities in a substrate therefore makes the substrates much more fragile then would otherwise be the case, and reduces their manufacturing yield.

Another problem is that the mechanical bond of the sensor to the substrate is often easy to break. This is because the bonding materials presently employed can only bond by entrapment or polymeric adhesion, and also because each lead wire is typically connected to the substrate only at one or two positions, making it easy to dislodge the sensors from their cavities by stresses applied to their lead wires. As a result, systems that employ more than five sensors on a substrate often can be used only once before one or more of the sensors become loosened or dislodged.

The lead wires need to be sheathed to prevent them from shorting out by contact with one another, and also to prevent them from chemically reacting with most substrates. However, currently available sheathing adds significant weight to the lead wires, and can contribute particulate contamination to high temperature process environments.

When the lead wires extend across the surface of the substrate, where the temperature is typically highest, they are subject to reaction with the surrounding environment. Thus, the environment within which a particular structure can function without damage is limited by the resistance of the lead wire material to reaction with and penetration by the surrounding environment. For example, type K TC wire is stable above 500° C. only in inert and hydrogen environments, while type S TC wire is stable above 700° C. only in inert and oxidizing atmospheres. Furthermore, none of these lead wires are stable in reactive process gas environments.

The $Al_2O_3/SiO_2$ mixtures used for bonding the sensors to the substrate tend to yield only glazes, and generally do not react aggressively with most oxidizable surfaces such as silicon of gallium arsenide wafers. The bond securing the sensor to the substrate tends to be relatively weak.

SUMMARY OF THE INVENTION

The object of the present invention is to provide a packaging system capable of securely holding a body to a substrate at elevated temperatures, and encapsulating the body and associated lead wires to protect them from harmful environments. While applicable in general to generic bodies intended to be exposed to high temperatures (of at least about 460° C.) when mounted on an oxidizable substrate, the invention is particularly useful in securing temperature and other environmental sensors and their associated lead wires to a semiconductor wafer.

A reacted borosilicate mixture (RBM) at least partially encapsulates the body and secures it relative to the substrate by means of an oxide interface formed between the RBM and substrate during the high temperature reaction process. The body can be non-oxidizable, in which case it is entrapped by the RBM and secured to the substrate by an oxide interface between the RBM and the substrate adjacent to the body. If the body is itself oxidizable, an oxide interface is also formed between the RBM and the body that provides additional bonding strength.

The RBM can either extend over a body which is in direct contact with the substrate, or the body can be completely encapsulated by the RBM. In the case of a thermal sensor in which the RBM is provided under as well as over the sensor, the RBM layer under the sensor is thin enough to provide a thermally conductive path between the substrate and sensor. The RBM is preferably a mixture of $B_2O_3$ and $SiO_2$, with the $B_2O_3$ content a function of the reaction temperature and the desired bonding strength and viscosity.

Lead wires for environmental sensors can also be secured to the substrate by encapsulating the wires in RBM along at least a portion of their lengths. The RBM electrically insulates the lead wires from each other, thus eliminating the need for wire sheathing. It also facilitates the provision of multiple lead wires in either a single common level relative to the substrate, or in a multi-layer bundle. An array of multiple sensors and associated lead wires can be secured to a common substrate by the RBM, with the lead wires connected to an output facility.

Further features and advantages of the invention will be apparent to those skilled in the art from the following detailed description, taken together with the accompanying drawings.

DETAILED DESCRIPTION OF THE INVENTION

Figure 1:
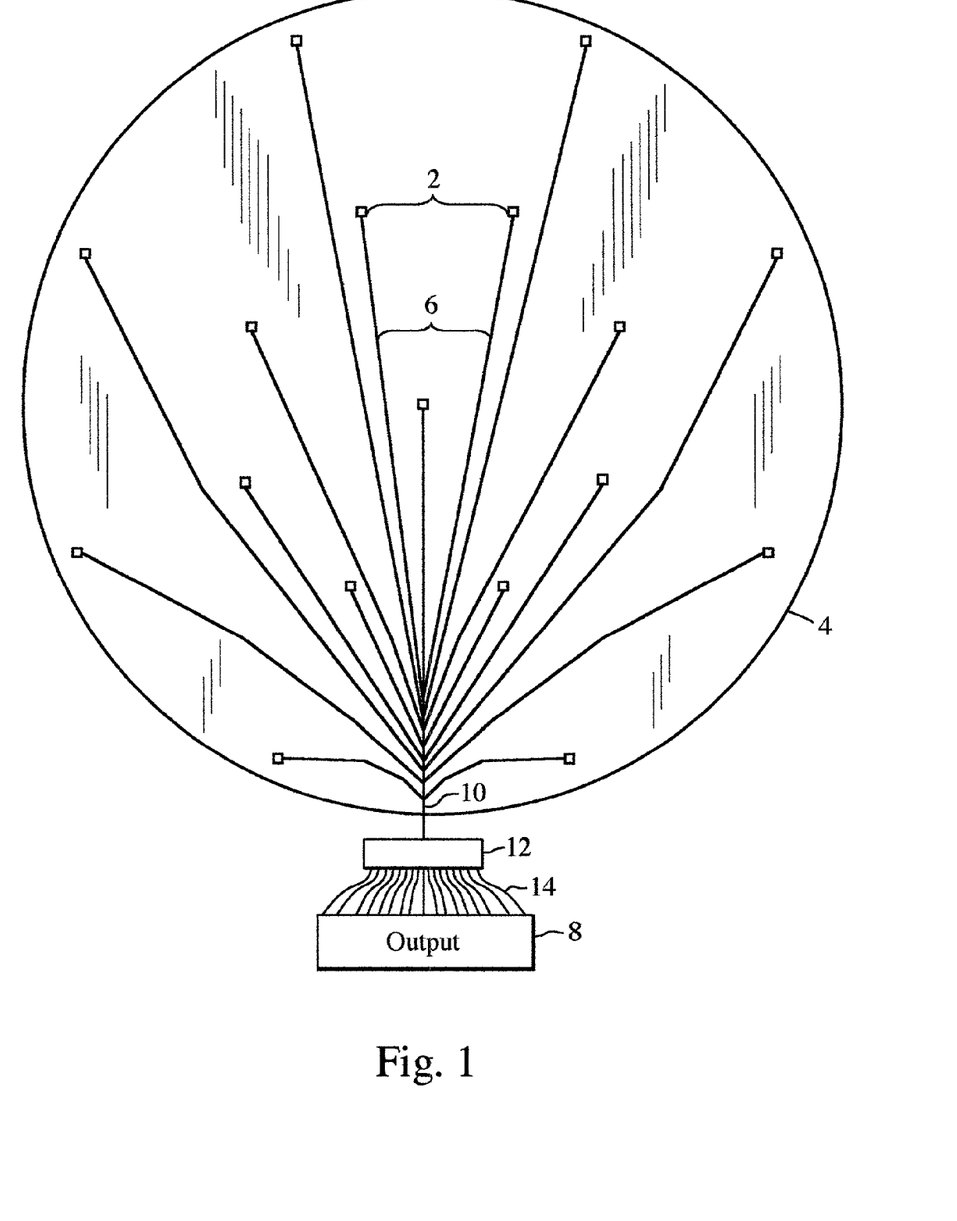
FIG. 1 is a plan view of an array of environmental sensors and associated lead wires distributed on a common substrate.

FIG. 1 illustrates one embodiment of the invention, in which an array of environmental sensors 2 are distributed over the surface of a substrate such as a semiconductor wafer 4 to detect a desired environmental parameter such as temperature, radiation, pressure, gas composition or gas concentration. While the term "substrate" refers to a semiconductor wafer in FIG. 1, the term is not intended to be limited to this type of structure, and in general encompasses any type of body to which another body can be secured as described below.

The sensors are electrically connected by respective lead wires 6 which extend along the wafer surface to an output facility 8, such as visual readout indicators for the various sensors. Each lead wire 6 shown in FIG. 1 represents a plurality of lead wires, normally 2,3 or 4, depending upon the type of sensor. The lead wires 6 can either be brought off the wafer individually or assembled into a bundle 10 which, for the 17 sensor system illustrated, preferably organizes the lead wires in a multi-layer stack. When multiple sensors are employed, the lead wires can be connected to a terminal block 12, which can be either on or off the wafer, with output wires 14 from the terminal block connecting the lead wire to the output facility 8. An input stimulus or energization can also be applied to the sensors through appropriate lead wires.

While 17 sensors are shown, this is for purposes of illustration only; greater or smaller numbers of sensors could also be employed. The lead wire paths and the location of the lead wire bundle 10, as well as the number of lead wire bundles, are matters of design choice. While a circular substrate is shown, the substrate can be of any desired shape or size.

Figure 2:
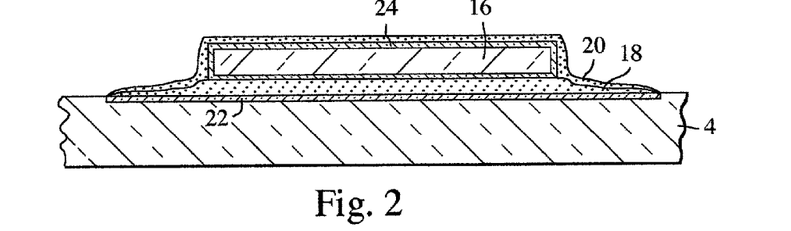
FIG. 2 is a sectional view of an oxidizable sensor chip completely encapsulated and bonded to a substrate by an RBM.

One way to secure the sensors to the substrate is illustrated in FIG. 2. In this example the sensor is provided as an AlN chip 16 which carries a SiC sensing element (not shown). This type of sensor is described in PCT Patent Application No. PCT/US00/07557 by the present inventor, published Nov. 30, 2000, the contents of which are hereby incorporated by reference. The sensor is secured to the wafer 4 by means of a reacted borosilicate mixture (RBM) of $SiO_2$ and $B_2O_3$. The RBM illustrated in FIG. 2 is applied in two steps: a first layer 18 on the wafer surface that underlies the chip 16 and extends along the wafer lateral to the chip, and a second layer 20 that overlies the chip and extends over the first RBM layer lateral to the chip. The composition and processing of the RBM are described in detail below. The first RBM layer 18 chemically bonds with the wafer 4 by forming a thin oxide interface 22, typically not more than 1,000 Angstroms thick. This RBM layer chemically and electrically isolates the chip 16 from the wafer, but is thin enough to permit efficient transfer of heat from the substrate to the wafer in the case of a temperature sensor.

Both RBM layers 18 and 20 chemically bond with the chip 16 by forming an oxide interface 24 with the chip during reaction of the RBM. Where it extends onto the wafer surface beyond the limits of lower RBM layer 18, the upper RBM layer 20 also forms an oxide interface with the wafer during the reaction process to extend the RBM-wafer oxide interface 22. A thicker oxide interface is formed with a wafer made from Si, GaAs or the like than with an AlN chip, which is less oxidizable than these wafer materials. Thus, only a small portion of wafer material, insufficient to effect its sensing capability, is consumed.

The arrangement illustrated in FIG. 2 is suitable for TC junctions. If desired to enhance heat transfer from the wafer, the TC junctions can be disposed within cavities in the wafer and secured by RBM layers as shown.

The oxide interfaces firmly secure the chip to the wafer. The chip retention is considerably stronger than prior epoxy and bonding techniques. Although for some temperature sensors it may be desirable to place the sensor within a cavity in the wafer for greater heat transfer, cavities are not required for mechanical adhesion of either the sensors or their lead wires, and for this purpose can be eliminated entirely.

While the RBM oxidizes a small portion of the chip 16, it effectively encapsulates the chip and protects it from more extensive oxidation that it would otherwise suffer in an oxidizing environment at elevated temperatures. Highly oxidizable materials such as tungsten might be completely oxidized by the environment when heated, but are protected by the RBM and lose only a small portion of their mass to oxidation during the thermal reaction process used to form the RBM.

Figure 3:
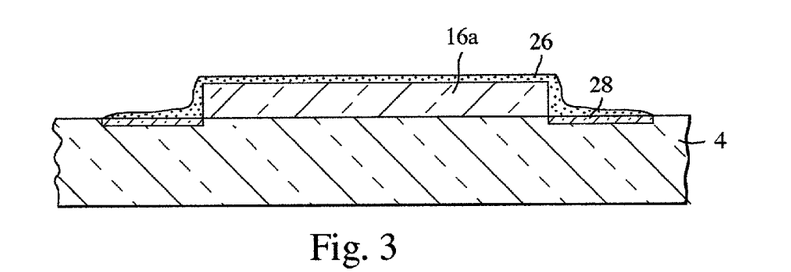
FIG. 3 is a sectional view of a non-oxidizable sensor chip encapsulated relative to a substrate by an overlying RBM.

Another embodiment of the invention is illustrated in FIG. 3. In this case the sensor chip 16a is formed from a non-oxidizable material such as gold or platinum. The chip 16a is placed directly in contact with the wafer 4 and coated with a single RBM layer 26, which extends onto the wafer lateral to the chip. When reacted, the RBM lateral to the chip forms a thin oxide interface 28 with the wafer, but no oxide is formed with the chip. In this case the chip is entrapped by the RBM, which securely holds it to the wafer via the RBM/wafer oxide interface 28, and protects it from the environment.

While the invention thus far has been described in terms of an environmental sensor secured to an underlying wafer, it is applicable in general to securing any type of body to an oxidizable substrate. If the body itself is oxidizable, the RBM chemically bonds with both the body and the substrate to produce a very strong adhesion mechanism. If only the substrate is oxidizable, the body is held on by entrapment, which is generally not as strong as bonding to both the substrate and body but is still considerably stronger than prior epoxy or $SiO_2$—$Al_2O_3$ bonding.

Figure 4:
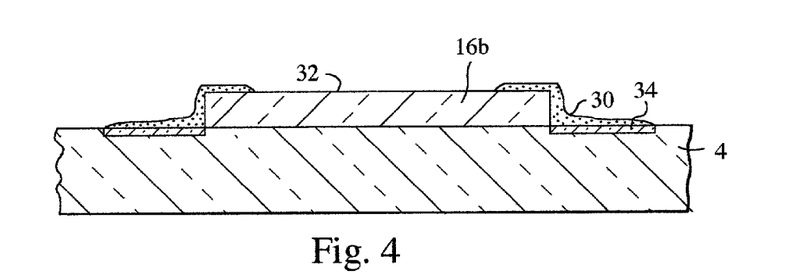
FIG. 4 is a sectional view of a partially encapsulated sensor bonded to a substrate by an RBM.

FIG. 4 illustrates another embodiment in which it is desired to expose a sensor chip 16b to the environment, for purposes such as environmental gas or radiation sensing. In this case the RBM 30 extends from the surface of substrate 4 over the edge of chip 16b and onto the upper surface of the chip a sufficient distance to securely hold the chip to the substrate. However, the RBM terminates short of the center of the chip, leaving a portion of the chip surface 32 exposed to the environment. The RBM forms a retaining oxide interface 34 with the substrate when it is reacted, and also forms an oxide interface with the chip if the chip is made of an oxidizable material. No such chip-RBM oxide interface is shown in FIG. 4, for the case of a non-oxidizable chip.

Figure 5:
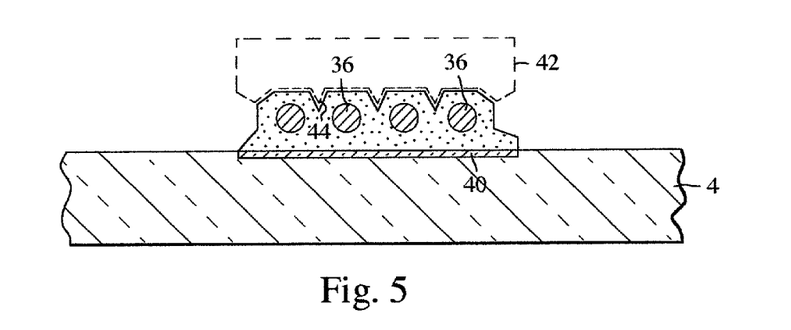
FIGS. 5 and 6 are sectional views of a single layer of lead wires and a multi-layer lead wire bundle, respectively, bonded to a substrate and insulated from each other by an RBM.

In addition to holding a sensor chip or other body onto a substrate, the RBM is also preferably employed to retain lead wires associated with the sensor on the substrate. This is illustrated in FIG. 5 for the case of a single layer, 4-wire bundle of lead wires 36. The lead wires are spaced from each other and fully encapsulated in an RBM 38, which forms an oxide interface 40 with the underlying substrate 4 when the RBM is reacted. The RBM both spaces and insulates the lead wires from each other, while securely retaining them relative to the substrate. While the RBM is shown after it has been reacted, a form 42 that can be used to maintain the spacing between lead wires and hold the lead wires in place during the reaction process is shown in dashed lines. The form 42 includes downward directed knife-edge protrusions 44 that extend around the upper portions of the lead wires for this purpose. The form is clamped in place over the RBM, lead wires and substrate during the reaction process, and then removed.

Figure 6:
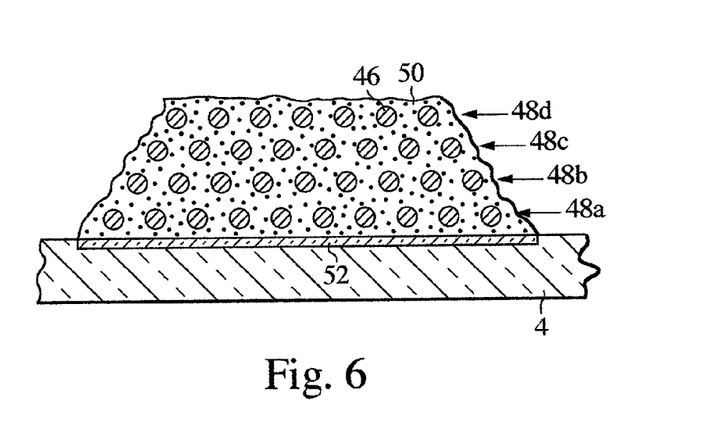

A greater number of lead wires can conveniently be accommodated in a multi-layer bundle, as illustrated in FIG. 6. Thirty-four lead wires 46 are illustrated, corresponding to two lead wires for each of the 17 sensors of FIG. 1; other types of sensors can employ different numbers of lead wires. The wires are arranged in four layers 48a, 48b, 48c and 48d. Each upper layer preferably contains fewer lead wires and the layer immediately below, with the positions of the lead wires staggered from layer to layer for greater structural integrity. In the illustration of FIG. 6 the first, second, third and fourth lead wire layers from the bottom of the bundle have 10, 9, 8 and 7 wires, respectively. All of the lead wires are spaced from each other and securely retained in place with respect to the substrate by a mass of RBM 50 that encapsulates at least a portion of the length of each lead wire, and is secured to the substrate 4 by an oxide interface 52 formed with the substrate during reaction of the RBM.

In encapsulating the lead wires 46, the RBM 50 can eliminate the need for lead wire sheathing. This reduces the overall weight of the device and also avoids particulate contamination at high temperatures that can occur with sheathing.

The RBM 50 may or may not chemically bond with the lead wires 46, depending upon whether the lead wires are or are not oxidizable. If a chemical bond with the lead wires does occur, the resulting oxide interface will generally be less than 1,000 Angstroms thick, which will still leave the bulk of the lead wires available for electrical conduction.

Figure 7:
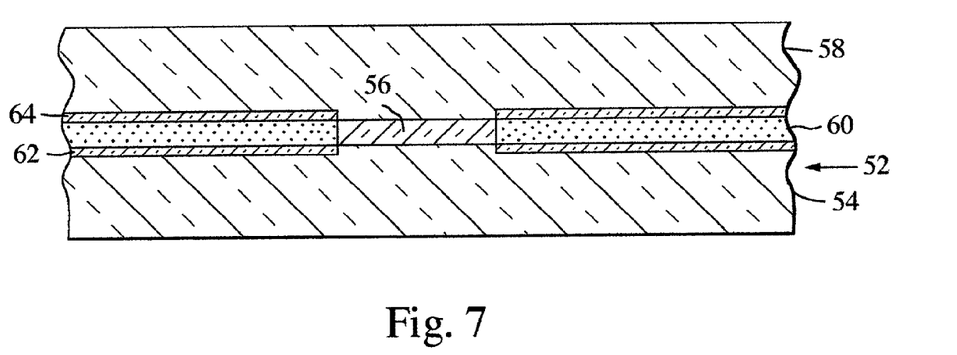
FIG. 7 is a sectional view of a process temperature instrumented wafer bonded to a cap wafer by an RBM.

An RBM as described herein can be used in general to adhere any two or more oxidizable bodies to each other. As an example, FIG. 7 illustrates a process temperature instrumented wafer (PTIW) 52 consisting of a semiconductor wafer 54 which bears a temperature sensor structure 56. The PTIW is capped by a second semiconductor wafer 58 which provides both mechanical and radiation protection for the sensor, and strengthens the overall device. The two wafers 54 and 58 are adhered to each other by an RBM layer 60 that surrounds the sensor 56 on the opposed surfaces of both wafers. The RBM forms oxide interfaces 62 and 64 with the wafers 54 and 58, respectively, when it is reacted at an elevated temperature, bonding the two wafers together. Heat is transferred through both wafers to the sensor. With or without sensors, two or more oxidizable wafers or other bodies can be adhered together through the RBM. The wafers can be of either similar or dissimilar materials, such as Si—Si, GaAs—GaAs or GaAs—Si. If desired, the RBM could be extended to encapsulate all or a desired portion of the overall structure.

Borosilicate compositions have historically been used for commercial glasses and glazes, such as crown glasses, flint glasses and pyrex glasses used to form beakers. However, they have not been used for high temperature retention purposes such as those proposed in the present application.

With a proper selection of RBM materials and fabrication technique, the RBM can be made to form an environmental barrier over sensors, other bodies and their associated lead wires that would otherwise be susceptible to degradation in anticipated environments. The properly formed RBM protects the underlying materials from all vapor and liquid environments, except those such as HF which are known to etch $SiO_2$.

It has been discovered that, with an appropriate proportion of $B_2O_3$, an $SiO_2$—$B_2O_3$ RBM will form an environmental barrier over sensors such as TC junctions, Pt RTD chips and any lead wires that may be susceptible to environmental degradation, that such a RBM will accommodate mismatches in thermal expansion between the lead wires and sensors on one hand and the substrate to which they are attached during both slow and rapid thermal cycling for commonly used materials, and that the thermal energy required to form the RBM will not damage the sensors, lead wires or substrate. The RBM functions as an electrical insulator up to at least 1300° C., and is both chemically and mechanically stable at temperatures in excess of 1300° C. It also retains a strong adhesion to oxidizable materials, via the formation of an oxide interface during thermal reaction, for temperatures of at least 1200° C.

Some important properties of $B_2O_3$ and $SiO_2$ for this purpose are:

A crystalline form melting temperature of 460° C. for $B_2O_3$ and 1610° C. for $SiO_2$.

A glass softening temperature of 1665° C. for $SiO_2$.

Both materials are excellent electrical insulators, and form a continuous substitutional glass mixture.

The thermal coefficient of expansion (TCE) of the RBM can be matched to particular sensor and substrate materials by an appropriate selection of the $SiO_2$—$B_2O_3$ mix ratio.

They can be mixed together and applied to surfaces as dry powders, permitting both surface and bulk reaction to occur simultaneously. They can also be applied as a paste, but the paste should be dried before being reacted to avoid spitting.

Crystalline form molecular weights of 69.62 grams/mole for $B_2O_3$ and 60.08 grams/mole for $SiO_2$.

Figures 8, 9:
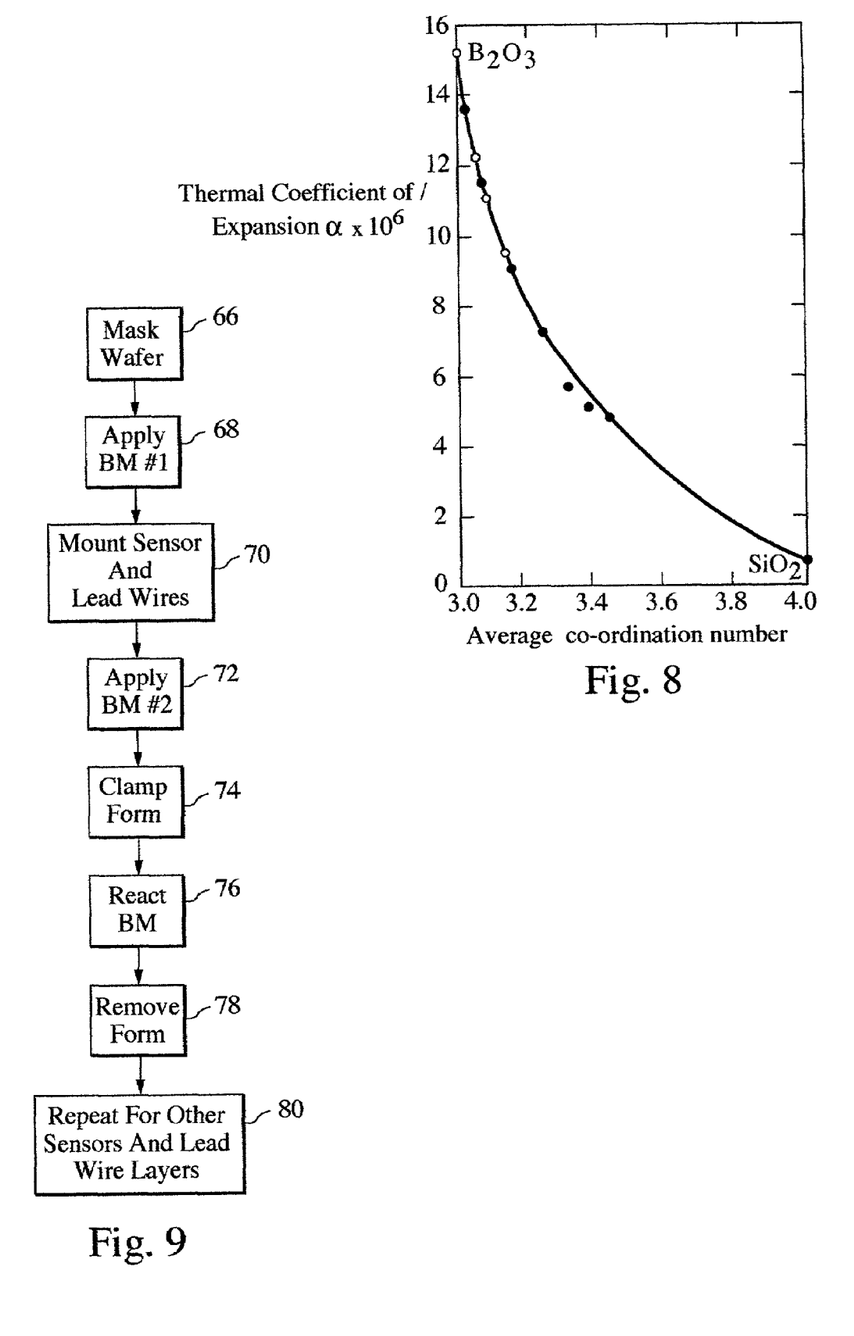
FIG. 8 is a graph of the thermal coefficient of expansion for $SiO_2$—$B_2O_3$ RBM as a function of the relative quantity of each constituent.
FIG. 9 is a flow diagram illustrating a method of securing a body to a substrate in accordance with the invention.

The TCE for the RBM is plotted as a function of the $SiO_2$—$B_2O_3$ average coordination number in FIG. 8. The "average coordination number" is a measure of the mole percentages of $SiO_2$ and $B_2O_3$ in the RBM in which 3.0 corresponds to 100% $B_2O_3$ and 4.0 corresponds to 100% $SiO_2$, with intermediate average coordination numbers being a linear function of the relative mole percentages. It can be seen that the TCE increases generally exponentially with increasing percentages of $B_2O_3$.

Typical ceramic substrates include, but are not limited to, $Al_2O_3$, alumina-silicates, alumina-boro-silicates, AlN, BeO, $B_4C$, BN, C, leachable-ceramics, glass-ceramics, mica, $SiO_2$ (glass and crystal), SiC, $Si_3N_4$, SrO, $TiB_2$, $TiO_x$, $(WC)_{94}Co_6$, $Y_2O_3$, magnesia-stabilized $Z_rO_2$, yttria-stabilized $Z_rO_2$, and $Z_rO_2$. Typical semiconductor substrates include, but are not limited to, Ge, Si, GaAs, InP, InSb, InAs, CdTe, CdInTe, HgCdTe, and SiC.

In general, the TCE of lead wires will be substantially greater than that of substrates, except for metallic substrates. For example, a type-K TC is comprised of a 90 wt % Ni/10 wt % Cr wire and a 95 wt % Ni/5 wt % AlSi wire. The TCE of each wire is approximately that of Ni, or about $16 \times 10^{-6}$/° K at 500° C. The TCE of Si is about $4.1 \times 10^{-6}$/° K at 500° C. This suggests that the RBM will need to accommodate significant expansion mismatches between the substrate and the wires during thermal cycling. Thus, the preferred RBM should have a low softening temperature so that it can absorb the expansion mismatch and "heal" itself during rapid thermal cycling. This calls for an RBM with greater than 70 wt % $B_2O_3$.

The starting $B_2O_3$ and $SiO_2$ materials for the RBM can be powder, grains or crystals. For adhesive and/or entrapment applications, the $B_2O_3$ and $SiO_2$ are preferably ground separately and then mixed; for environmental barrier applications, the $B_2O_3$ and $SiO_2$ are preferably first mixed together, and the mixture ground into a fine powder. In both cases the average post grinding particle size should be less than 500 microns, the smaller the better. It can be applied to the sensor and substrate surfaces as a dry powder or dispersed in an organic solvent, which should be dried before reacting to prevent spitting.

A reaction takes place when the $B_2O_3/SiO_2$ mixture and the components upon which it is placed are heated to at least 460° C., preferably in an oxidizing or alternatively in an inert (Ar or $N_2$) atmosphere. The reaction temperature should not exceed 1300° C. Heating can be accomplished by conventional and rapid thermal techniques. The reaction proceeds most favorably when the components are passed through the melting temperature of $B_2O_3$ as rapidly as possible. The preferred heating technique is anticipated to be rapid thermal annealing using IR heating.

In general, higher reaction temperatures will tend to produce a more vigorous reaction. This reduces the chance of residual unreacted $B_2O_3$ being left after the reaction in case the $SiO_2$ and $B_2O_3$ have not been mixed well enough or they have not been ground to a sufficiently small particle size. Also, higher reaction temperatures encourage the formation of a RBM glass that completely encapsulates a body over which the RBM has been applied, rather than a glaze. For lower reaction temperatures, the proportion of $B_2O_3$ in the mix should be increased to retain good adhesion characteristics between the RBM and the bodies it adheres together.

The reaction temperature will often be limited by the thermal capability of the materials with which the RBM is used. For example, GaAs should generally not be heated to more than about 900° C., while a silicon substrate bearing a device structure should not be heated to more than about 1,100° C., and then only for very short periods of time.

Factors other than the reaction temperature that can affect the relative proportions of $SiO_2$ and $B_2O_3$ in the mixture include the desired bonding strength and viscosity of the RBM. Lowering the proportion of $B_2O_3$ increases the RBM's viscosity, resulting in a higher bonding strength. On the other hand, a higher viscosity means the RBM has a lower TCE and does not flow as easily. This makes it less able to tolerate bonding to combinations of materials having significant TCE differences when operated over a temperature range that produces serious expansion mismatches between the materials. In general, the selection of the $SiO_2/B_2O_3$ ratio will involve a balancing among the reaction temperature and the desired bonding strength and viscosity.

A One fabrication technique for mounting a sensor to a wafer substrate is illustrated in FIG. 9. This can be used to form the structure illustrated in FIG. 2. In the first step 66, the wafer is masked to expose only those areas for which RBM is desired. Alternately, RBM could be applied over the entire wafer, especially if the wafer is devoted exclusively to sensors and their associated lead wires. In the next step 68, a layer of the desired borosilicate mixture (BM) is applied to the exposed wafer surface if a mask is used, or over the entire wafer surface if there is no mask. This BM layer should have a thickness (within the range of about 0.1 mm–10 mm, with the lower end of the range preferred for a thermal sensor to avoid significant interference with heat transfer from the wafer to the sensor.

In the next step 70 the sensor and its lead wires are laid down over the unreacted BM layer so that the lead wires extend from the sensor to beyond the edge of the wafer (or to any terminal block that may be provided on the wafer). A second layer of unreacted BM powder (wet or dry) is then applied over the sensor, lead wires and first BM layer in step 72, followed by clamping a form such as that shown in FIG. 5 over the lead wires to space the wires from each other and hold the wires and the sensor against the first unreacted BM layer (step 74).

The assembly is then placed in an oven or furnace and heated to at least 500° C. for at least 15 seconds, with a thermal ramp that passes through the 460° C. $B_2O_3$ melting temperature as rapidly as possible (step 76). This causes the BM to cure and chemically bond with any underlying oxidizable surfaces via a thin oxide layer, thus forming a strong mechanical attachment of the RBM to the material with which it has bonded. The procedure for the first sensor is completed in step 78 by removing the form, and inspecting and qualifying the part.

Multiple sensors can be mounted to the wafer simultaneously by this method, as long as their lead wires are brought off of the wafer in a single layer. If multi-layer lead wire bundles are desired, all of the sensors having lead wires in the lowermost layer can be mounted simultaneously as described, followed by removal of the mask. A new mask is then applied to expose the RBM over the first lead wire layer, and also the areas on the wafer that will be occupied by the next set of sensors and their associated lead wires. The second layer of lead wires will extend over the wafer surface from their associated sensors until they reach the first lead wire layer, at which point they cross over to the top of the RBM covering the first lead wire layer as illustrated in FIG. 6. The second set of sensors and lead wires are then coated with another BM layer, and the unreacted BM is cured as before. The process is repeated for each subsequent lead wire layer and its associated sensors, as indicated by step 80.

The invention has been successfully demonstrated by several tests in which various types of chips were mounted onto ceramic and semiconductor surfaces.

Test 1

AlN chips which carried SiC temperature sensors were mounted to Si wafers using RBM as described above, with a $B_2O_3$ wt. % of 50 to 75. The resulting structures were inserted into an atmospheric tube furnace at 600° C., 800° C., 1000° C. and 1200° C. In each test the structures were left in the furnace for five minutes, then removed from the furnace and placed on a cold metal plate, with a maximum time between removal from the furnace and placement on the plate of thirty seconds. The chips remained bonded to the wafers in all cases. However, except for the 600° C. test, the wafers cracked from thermal shock when placed on the cold plate.

Test 2

The same type of chips as in Test 1 were mounted onto GaAs wafers using RBM as described. The resulting structures were inserted into an inert atmosphere in a tube furnace, and heated and cooled as in Test 1 (except no test was performed at 1200° C., which is above the GaAs melting temperature). All of the chips remained bonded to the GaAs wafers, and all GaAs wafers cracked from thermal shock when placed on the cold plate.

Test 3

$Al_2O_3$ ceramic chips were mounted onto Si wafers using $SiO_2$—$B_2O_3$ RBM to emulate the surface mounting of platinum TFRTDs, and tested as in Test 1. The chips remained bonded to the wafers in all cases when the $B_2O_3$ wt. % in the RBM was at least 75%, but did not adhere at lower percentages. Except for the 600° C. test, all of the wafers cracked from thermal shock when placed on the cold plate.

Test 4

The Test 1 procedure was performed for small Si, GaAs, SiC and AlN chips mounted on $Al_2O_3$ ceramic dies with RBM. The chips remained bonded to the dies in all cases when the $B_2O_3$ wt. % in the RBM was at least 75%, but did not adhere for lower percentages. All dies cracked from thermal shock when placed on the cold plate.

Test 5

Si, GaAs, SiC, $Al_2O_3$ and AlN chips were mounted onto pyrolytic-boron-nitride (PBN) dies using RBM, and tested as in Test 1. The chips remained bonded to the ceramic dies in all cases when the $B_2O_3$ wt. % was at least 70% except for $Al_2O_3$, which required the $B_2O_3$ wt. % to be at least 75%.

Test 6

Si, GaAs, SiC, $Al_2O_3$, PBN and AlN chips were mounted onto graphite using RBM and tested as in Test 1. The results were the same as for Test 5.

Test 7

Si, GaAs, SiC, $Al_2O_3$, PBN, AlN and graphite chips were mounted on fused quartz ($SiO_2$ glass) using RBM, and tested as in Test 1. The chips remained bonded to the fused quartz in all cases when the $B_2O_3$ wt. % in the RBM was at least 70% except for $Al_2O_3$, which required the $B_2O_3$ wt. % in the RBM to be at least 75%. All fused quartz (glass) substrates cracked when place on the cold plate.

Test 8

Si, GaAs, SiC, $Al_2O_3$ and AlN chips were mounted onto crystalline $SiO_2$ using RBM and tested as in Test 1. The results were the same as for Test 7.

The RBM was found to work best on non-oxide materials. In the case of oxides, specifically $Al_2O_3$ and $SiO_2$, the bond is not as strong as for non-oxide substrates. However, the bond to $SiO_2$ was stronger than to crystalline $Al_2O_3$.

Test 9

To test the high temperature thermal encapsulation capabilities of the RBM, thin films of tungsten metal, approximately 1000 Angstroms thick, were deposited on AlN ceramic dies and partially coated with unreacted $B_2O_3+SiO_2$ powder, with $B_2O_3$ wt. % s equal to and greater than 50%. The assemblies were then placed in an atmospheric tube furnace at 1000° C. for five minutes, removed from the furnace, and allowed to cool in air. The tungsten not coated by RBM was completely oxidized, as evidenced by a yellow color and electrical probing which showed it to be an insulator. The RBM was etched from the coated portion of the tungsten with HF. The tungsten that had been coated was still intact, and its conductivity was unchanged from the value exhibited before coating and heat treatment. Since tungsten oxidizes very readily in air, this test confirmed the ability of the RBM to protect metals from oxidizing during as well as after its formation, and strongly infers that the rate of reaction from a mixed powder to RBM is very rapid.

While several embodiments of the invention have been shown and described, numerous variations and alternate embodiments will occur to those skilled in the art. Accordingly, it is intended that the invention be limited only in terms of the appended claims.

I claim:

1. A bonded structure, comprising:
   an oxidizable substrate,
   a body to be secured to said substrate, and
   a reacted borosilicate mixture (RBM) extending over and lateral to said body and securing said body relative to said substrate at least partially by an oxide interface with the substrate lateral to said body.

2. The bonded structure of claim 1, wherein said RBM also extends between said body and said substrate.

3. The bonded structure of claim 2, wherein the RBM between said body and said substrate is thin enough to be substantially thermally conductive and said body comprises a thermal sensor.

4. The bonded structure of claim 1, wherein said body directly contacts said substrate.

5. The bonded structure of claim 1, wherein said RBM encapsulates said body relative to said substrate.

6. The bonded structure of claim 1, wherein said RBM extends over the edges of said body and leaves a portion of said body exposed.

7. The bonded structure of claim 1, wherein said body is oxidizable, and an oxide interface secures said RBM to said body.

8. The bonded structure of claim 1, wherein said body is substantially non-oxidizable.

9. The bonded structure of claim 1, said RBM comprising a reacted mixture of $B_2O_3$ and $SiO_2$ with said $B_2O_3$ at least 50 wt. % of said mixture.

10. The bonded structure of claim 9, wherein said $B_2O_3$ is at least 70 wt. % of said mixture.

11. The bonded structure of claim 1, wherein said body comprises an environmental sensor having an electrical output.

12. The bonded structure of claim 11, further comprising at least one lead wire for said sensor secured relative to said substrate by an overlying lead wire RBM along at least a portion of its length.

13. The bonded structure of claim 12, wherein said lead wire RBM and the RBM for said sensor comprise a continuous RBM layer.

14. The bonded structure of claim 12, wherein said lead wire RBM extends lateral to each of said lead wires and between each of said lead wires and said substrate.

15. The bonded structure of claim 11, further comprising an array of additional sensors secured to said substrate by an overlying RBM.

16. The bonded structure of claim 15, further comprising a plurality of lead wires for said sensors secured relative to said substrate by an overlying lying lead wire RBM along at least a portion of their lengths.

17. The bonded structure of claim 16, wherein said lead wire RBM insulates said lead wires from each other.

18. The bonded structure of claim 17, wherein said lead wires are disposed on a single common level relative to said substrate.

19. The bonded structure of claim 17, wherein said lead wires are disposed in a multi-layer bundle relative to said substrate.

20. A lead wire system, comprising:
a substrate,
at least one electrically conductive lead wire, and
a reacted borosilicate mixture (RBM) extending over and lateral to each of said lead wires and securing each of said lead wires relative to said substrate for at least a portion of their lengths.

21. The lead wire system of claim 20, wherein said substrate is oxidizable, and said RBM secures each of said lead wires to said substrate by an oxide interface with said substrate.

22. The lead wire system of claim 20, wherein said RBM extends between each of said lead wires and said substrate.

23. The lead wire system of claim 20, comprising a plurality of said lead wires.

24. The lead wire system of claim 23, wherein at least some of said lead wires are adjacent to each other and insulated from each other by said RBM.

25. The lead wire system of claim 23, wherein said lead wires are disposed on a single common level relative to said substrate.

26. The lead wire system of claim 23, wherein said lead wires are disposed in a multi-layer bundle relative to said substrate.

27. The lead wire system of claim 23, wherein said lead wires and said RBM extend to the edge of said substrate.

28. The lead wire system of claim 23, further comprising a terminal block for said lead wires.

29. The lead wire system of claim 28, wherein said terminal block is on said substrate.

30. The lead wire system of claim 28, wherein said terminal block is off said substrate.

31. An environmental sensing system, comprising:
a substrate,
an environmental sensor adjacent to said substrate, and
a reacted borosilicate mixture (RBM) extending over said sensor and at least a portion of said substrate lateral to said sensor to secure said sensor relative to said substrate.

32. The sensing system of claim 31, wherein said RBM also extends between said sensor and said substrate.

33. The sensing system of claim 31, wherein said substrate is oxidizable and said RBM secures said sensor to said substrate by an oxide interface with the substrate.

34. The sensing system of claim 31, said RBM comprising a reacted mixture of $B_2O_3$ and $SiO_2$, with said $B_2O_3$ at least 50 wt. % of said mixture.

35. The sensing system of claim 31, further comprising at least one lead wire for said sensor secured relative to said substrate by an overlying lead wire RBM along at least a portion of its length.

36. The sensing system of claim 31, further comprising an array of additional sensors secured to said substrate by an overlying RBM.

37. The sensing system of claim 31, wherein said RBM encapsulates said sensor relative to said substrate.

38. An environmental sensing system, comprising:
a substrate,
an environmental sensor,
an output facility for providing a response to signals from said sensor,
at least one lead wire connecting said sensor to said output facility, and
a reacted borosilicate mixture (RBM) at least partially encapsulating said sensor and lead wires and securing them relative to said substrate.

39. The sensing system of claim 38, wherein said substrate is oxidizable and said RBM secures said sensor and lead wires to said substrate by an oxide interface with the substrate.

40. The sensing system of claim 38, said RBM comprising a reacted mixture of $B_2O_3$ and $SiO_2$, with said $B_2O_3$ at least 70 wt. % of said mixture.

41. The sensing system of claim 38, further comprising an array of additional sensors at least partially encapsulated and secured relative to said substrate by an RBM, and respective lead wires for said additional sensors encapsulated and secured relative to said substrate by a lead wire RBM along at least a portion of their lengths and connecting their respective sensors to said output facility.

42. The sensing system of claim 41, wherein said lead wire RBM insulates said lead wires from each other.

43. A method of securing a body to a substrate, comprising:
placing said body on said substrate,
coating at least an overlying portion of said body and at least a portion of said substrate lateral to said body with a borosilicate mixture (BM), and
reacting said BM to secure said body relative to said substrate.

44. The method of claim 43, wherein said substrate is oxidizable but not oxidized when said body is placed on it, and said reaction step forms an oxide interface between said BM and substrate.

45. The method of claim 43, said body comprising an environmental sensor having an electrical output, further comprising the steps of placing at least one lead wire for said sensor on said substrate in electrical contact with said sensor, coating at least an overlying portion of the length of said lead wires and a portion of said substrate lateral to said lead wires with said BM, and reacting the BM on the coated portion of said wires along with the BM on said sensor to secure said lead wire portion relative to said substrate.

46. The method of claim 45, wherein a BM layer is provided on said substrate prior to placing said lead wires, said lead wires are placed on the substrate with said BM layer between them and the substrate, and said BM layer is reacted along with the BM coating said sensor and lead wires to encapsulate said lead wires and insulate them from each other with reacted BM (RBM).

47. The method of claim 46, wherein a shaped form is applied over the BM coating said lead wires to space said lead wires from each other and hold them against the underlying BM layer during said reaction.

48. The method of claim 46, wherein said BM layer also extends under said sensor so that said sensor is encapsulated in RBM when said BM layer and BM coating are reacted.

49. The method of claim 43, said EM comprising a mixture of $B_2O_3$ and $SiO_2$.

50. The method of claim 49, said $B_2O_3$ comprising at least 70 wt. % of said mixture.

51. The method of claim 49, wherein said BM is reacted at a temperature greater than 460° C.

* * * * *

UNITED STATES PATENT AND TRADEMARK OFFICE
CERTIFICATE OF CORRECTION

PATENT NO. : 6,995,691 B2
DATED : February 7, 2006
INVENTOR(S) : James D. Parsons It is certified that error appears in the above-identified patent and that said Letters Patent is hereby corrected as shown below:

Column 14,
Line 11, change "EM" to -- BM --.

Signed and Sealed this

Thirtieth Day of May, 2006

JON W. DUDAS
*Director of the United States Patent and Trademark Office*